United States Patent
Schneider

(10) Patent No.: US 12,124,839 B2
(45) Date of Patent: Oct. 22, 2024

(54) BSIDIFF DELTA UPGRADE IN EXTERNAL STORAGE

(71) Applicant: Honeywell International Inc., Charlotte, NC (US)

(72) Inventor: Maximilian Waldo Schneider, Mainz (DE)

(73) Assignee: Honeywell International Inc., Charlotte, NC (US)

( * ) Notice: Subject to any disclaimer, the term of this patent is extended or adjusted under 35 U.S.C. 154(b) by 116 days.

(21) Appl. No.: 17/646,040

(22) Filed: Dec. 27, 2021

(65) Prior Publication Data

US 2023/0205514 A1    Jun. 29, 2023

(51) Int. Cl.
*G06F 8/654*    (2018.01)
*G06F 12/0802*    (2016.01)
*H03M 7/46*    (2006.01)

(52) U.S. Cl.
CPC .......... *G06F 8/654* (2018.02); *G06F 12/0802* (2013.01); *G06F 2212/401* (2013.01); *H03M 7/46* (2013.01)

(58) Field of Classification Search
CPC ............. G06F 8/654; G06F 12/0802; G06F 2212/401; H03M 7/46
See application file for complete search history.

(56) References Cited

U.S. PATENT DOCUMENTS

| | | | | |
|---|---|---|---|---|
| 5,359,676 A | * | 10/1994 | Fan | H04N 1/411 382/246 |
| 5,835,740 A | | 11/1998 | Wise | |
| 6,081,752 A | | 6/2000 | Benson, IV et al. | |
| 6,636,958 B2 | | 10/2003 | Abboud et al. | |
| 7,111,142 B2 | * | 9/2006 | Spencer | G06F 12/0238 711/170 |

(Continued)

FOREIGN PATENT DOCUMENTS

| | | |
|---|---|---|
| EP | 2017726 A2 | 1/2009 |
| EP | 2711858 A1 | 3/2014 |

(Continued)

OTHER PUBLICATIONS

European Search Report mailed Jun. 1, 2023, issued in connection with corresponding EP Application No. 22214493.3 (8 pages total).

(Continued)

*Primary Examiner* — Douglas M Slachta
(74) *Attorney, Agent, or Firm* — John Maldjian, Esq.; Stevens & Lee PC

(57) ABSTRACT

A method includes inputting a decompressing compressed image in a computing device. The method also includes applying one or more delta images by a processor to reduce a transfer time for the inputted and decompressed patch image. The method also includes performing one or more calls to a system of memory caches for reads and writes of the decompressed patch image and additional input and output due to a shortage of space in an internal random-access memory (RAM). The method also includes locating arbitrary storage to redirect the decompressed patch image and the additional input and output. The method also includes redirecting the inputted decompressed patch image and the additional input and output to the arbitrary storage.

18 Claims, 4 Drawing Sheets

(56) References Cited

U.S. PATENT DOCUMENTS

| | | | |
|---|---|---|---|
| 7,549,042 | B2 | 6/2009 | Glaum et al. |
| 7,657,533 | B2* | 2/2010 | Gold ................. G06F 11/1451 707/821 |
| 7,734,932 | B2* | 6/2010 | Buer ....................... G06F 21/51 713/193 |
| 7,747,980 | B2 | 6/2010 | Illowsky |
| 7,805,719 | B2 | 9/2010 | O'Neil |
| 7,886,093 | B1 | 2/2011 | Chen |
| 8,055,096 | B2 | 11/2011 | Dahms et al. |
| 8,135,958 | B2 | 5/2012 | Greco et al. |
| 8,201,054 | B2 | 6/2012 | Slyz et al. |
| 8,341,604 | B2 | 12/2012 | Codrescu |
| 8,522,233 | B2 | 8/2013 | Nakamura et al. |
| 8,943,492 | B2 | 1/2015 | Scian et al. |
| 9,720,616 | B2 | 8/2017 | Yu |
| 10,055,353 | B2 | 8/2018 | Nachimuthu et al. |
| 10,972,741 | B2 | 4/2021 | Simpson |
| 10,983,704 | B1* | 4/2021 | Van Gaasbeck ...... G06F 3/0673 |
| 2003/0022665 | A1* | 1/2003 | Rajaram ............... H04W 8/245 455/418 |
| 2005/0114852 | A1 | 5/2005 | Chen et al. |
| 2009/0070374 | A1* | 3/2009 | Eker ....................... G06F 8/658 |
| 2009/0274294 | A1* | 11/2009 | Itani ........................ H03M 7/46 380/28 |
| 2010/0325523 | A1 | 12/2010 | Slyz et al. |
| 2012/0102477 | A1* | 4/2012 | Kim ........................ G06F 8/654 717/169 |
| 2012/0150877 | A1* | 6/2012 | Ramamurthy .......... G06F 16/20 707/E17.104 |
| 2012/0198154 | A1* | 8/2012 | Keith, Jr. ............ G06F 11/1448 711/E12.001 |
| 2012/0227036 | A1* | 9/2012 | Crk ........................ G06F 8/658 717/177 |
| 2013/0024545 | A1* | 1/2013 | Sheppard ....... H04N 21/234318 709/217 |
| 2016/0378511 | A1* | 12/2016 | Jung ....................... G06F 3/067 713/2 |
| 2017/0048303 | A1* | 2/2017 | Szilagyi ................. H04L 67/06 |
| 2017/0090903 | A1* | 3/2017 | Bainville .................. G06F 8/71 |
| 2017/0118675 | A1 | 4/2017 | Boch |
| 2017/0212750 | A1* | 7/2017 | Stutzenberger ......... F04B 17/03 |
| 2017/0337204 | A1* | 11/2017 | Szilagyi ................. G06F 16/71 |
| 2018/0060235 | A1 | 3/2018 | Yap et al. |
| 2018/0095668 | A1 | 4/2018 | Malyugin et al. |
| 2018/0173723 | A1 | 6/2018 | Pfeifle et al. |
| 2019/0146775 | A1* | 5/2019 | Wang ..................... H04L 67/34 717/169 |
| 2019/0265965 | A1 | 8/2019 | Acharya et al. |
| 2019/0324646 | A1 | 10/2019 | Homma |
| 2020/0118516 | A1 | 4/2020 | Kim |
| 2020/0241988 | A1* | 7/2020 | Toya ................... G06F 11/3024 |
| 2020/0310782 | A1 | 10/2020 | Ujiie et al. |
| 2021/0373881 | A1* | 12/2021 | Schneider ............... G06F 8/658 |
| 2023/0168928 | A1 | 6/2023 | Schneider |
| 2023/0169020 | A1 | 6/2023 | Schneider |
| 2023/0205514 | A1 | 6/2023 | Schneider |

FOREIGN PATENT DOCUMENTS

| | | | |
|---|---|---|---|
| EP | 3680773 A1 * | 7/2020 | ............... G06F 8/64 |
| JP | 2003-216465 A | 7/2003 | |
| KR | 10-1003888 B1 | 12/2010 | |
| KR | 10-1541112 B1 | 1/2015 | |
| WO | 2010017326 A1 | 2/2010 | |
| WO | 2018091085 A1 | 5/2018 | |
| WO | 2019042546 A1 | 3/2019 | |
| WO | 2019077607 A1 | 4/2019 | |
| WO | 2020088913 A1 | 5/2020 | |

OTHER PUBLICATIONS

GZIP(1): General Commands Manual, 1993, Jean-Ioup Gailly (7 pages total).

History of Lossless Data Compression Algorithms, Jan. 2019 (19 pages total).

Moran, Brendan et al. "A Firmware Update Architecture for Internet of Things." Retrieved from: https://tools.ietf.org/id/draft-ietf-suit-architecture-08.html, Retrieved on Jun. 17, 2021 (18 pages total).

Usama M, Zakaria N (2017) Chaos-Based Simultaneous Compression and Encryption for Hadoop. PLoS One 12(1): e0168207. https://doi.org/10.1371/journal.pone.0168207 (18 pages total).

T. Subhamastan Rao et al, / (IJCSIT) International Journal of Computer Science and Information Technologies, vol. 2(5), 2011, 2369-2374 (6 pages total).

Pillai, Vysakh P., "Secure firmware upgrade for embedded systems" (2017) Retrieved from: https://embeddedinn.xyz/articles/tutorial/Secure-Firmware-upgrade-for-embedded systems/, Retrieved on: Jul. 7, 2021 (7 pages total).

Reddy, Rakesh, "Upgrading Embedded Design Firmware via USB", Published in Embedded.com (http://www.embedded.com) Jun. 2008 (5 pages total).

McDonagh, Colin, "Efficient Wireless Incremental Updates to Resource-Constrained Devices", Dissertation submitted to the University of Dublin, Trinity College, May 2018 (66 pages total).

Stolikj, M., Cuijpers, P. J. L., & Lukkien, J. J. (2012). Efficient reprogramming of sensor networks using incremental updates and data compression. (Computer science reports; vol. 1210). Eindhoven: Technische Universiteit Eindhoven (14 pages total).

European Search Report mailed May 15, 2023 issued in connection with corresponding EP Application No. 22211904.2 (12 pages total).

European Search Report mailed Apr. 5, 2023 issued in connection with corresponding EP Application No. 22210343.4 (11 pages total).

European Search Report mailed May 23, 2023 issued in connection with corresponding EP Application No. 22210345.9 (8 pages total).

Kumar Amit Mehta, "Fail-proof Over the Air Firmware Upgrade for Embedded Systems", 2016, Tallinn University of Technology, 2019, (80 pages).

Krishnan et al., "Secure Intermittent Computing Protocol: Protecting State Across Power Loss", IEEE Xplore, 2019, (6 pages).

Canadian Office Action mailed May 3, 2024; issued in connection with corresponding Canadian Patent Application No. 3,183,509 (5 pages total).

Canadian Office Action mailed May 2, 2024; issued in connection with corresponding Canadian Patent Application No. 3,183,469 (6 pages total).

* cited by examiner

BSIDIFF DELTA UPGRADE IN EXTERNAL STORAGE

TECHNICAL FIELD

The present disclosure generally relates to redirecting input and output to arbitrary storage and reducing patch file size by applying run length encoding before compression.

BACKGROUND

A BSDIFF delta image algorithm is marketed to embedded systems. However, such a BSDIFF delta image algorithm fails to meet the stringent requirements of embedded platforms. Applying delta images to firmware upgrade can allow for a reduction in transfer time and reduce costs on the customer side.

Nevertheless, using the BSDIF delta image algorithm is not usable in embedded environments. The limited RAM space that is available in embedded environments make the BSDIFF delta image algorithm unusable. As such, the ability to operate on arbitrary storage that includes one or more serial devices is needed.

Another issue is that the BSDIFF algorithm produces a patchfile that is highly compressible with most common compression algorithms. However, the patchfile tends to be larger than most input files, which leads to problems in space constrained applications.

In applications where, there is constrained space, there is a need to reduce the patch file size. Reducing the patch file size and enabling the patching algorithm to work in place are needed. Under such conditions, storage areas can overlap between the patchfile and another image.

SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

The aforementioned aspects and other objectives can now be achieved as described herein.

In an embodiment, a method includes inputting and decompressing a compressed patch image in a computing device. The method also includes applying one or more delta images by a processor to reduce a transfer time for the decompressed patch image. The method also includes performing one or more calls to a system of memory caches by the processor for reads and writes of the decompressed patch image and additional input and output due to a shortage of space in an internal random-access memory (RAM). Further, the method includes locating arbitrary storage by the processor to redirect the decompressed image and the additional input and output. The method also includes redirecting the decompressed image and the additional input and output by the processor to the located arbitrary storage.

The decompressed patch image is redirected to the arbitrary storage that is within a same computing system as the computing device.

The additional input and output is redirected to the arbitrary storage located in an external system.

The method also includes adding additional memory caches to provide increased patch application speed.

In an embodiment, a method includes receiving one or more inputted compressed patch images into one or more computing devices. The method also includes attempting to store the one or more inputted compressed patch images by at least one processor into an internal random-access memory (RAM). Further, the method includes performing calls to a system of memory caches to store the inputted compressed patch images due to a lack of storage space in the available RAM. In addition, the at least one processor performs calls to a system of memory caches to facilitate redirecting the inputted compressed images, and locating one or more serial devices by the processor. Further, the method includes redirecting the at least one or more inputted compressed images to the one or more serial devices.

The one or more inputted compressed images are decompressed and redirected to at least one electrically erasable programmable read-only memory (EEPROM).

The method further includes enabling a patching algorithm to work directly on an encoded patch file.

The method also includes reducing patch file size by applying run length encoding.

In an embodiment, a system includes a computing device receiving an inputted compressed patch image that is decompressed at a later time interval. A processor applying one or more delta images contained in the decompressed patch image to facilitate an overall reduction in transfer time of the decompressed patch image. The processor is also performing one or more calls to a system of memory caches for reads and writes of the decompressed patch image and additional input and output due to a shortage of space in an internal random-access memory (RAM). The processor also locates arbitrary storage to redirect the decompressed patch image and the additional input and output. The system also includes the arbitrary storage that received the redirected decompressed patch image and the additional input and output.

The arbitrary storage includes a patchfile overlapping with a resulting image.

The processor removes run length encoding after decompression.

A size of a patchfile is reduced.

BRIEF DESCRIPTION OF THE FIGURES

The accompanying figures, in which like reference numerals refer to identical or functionally similar elements throughout the separate views and which are incorporated and form a part of the specification, further illustrate the present invention and, together with the detailed description of the invention, serve to explain the principles of the present invention.

Figure 1:
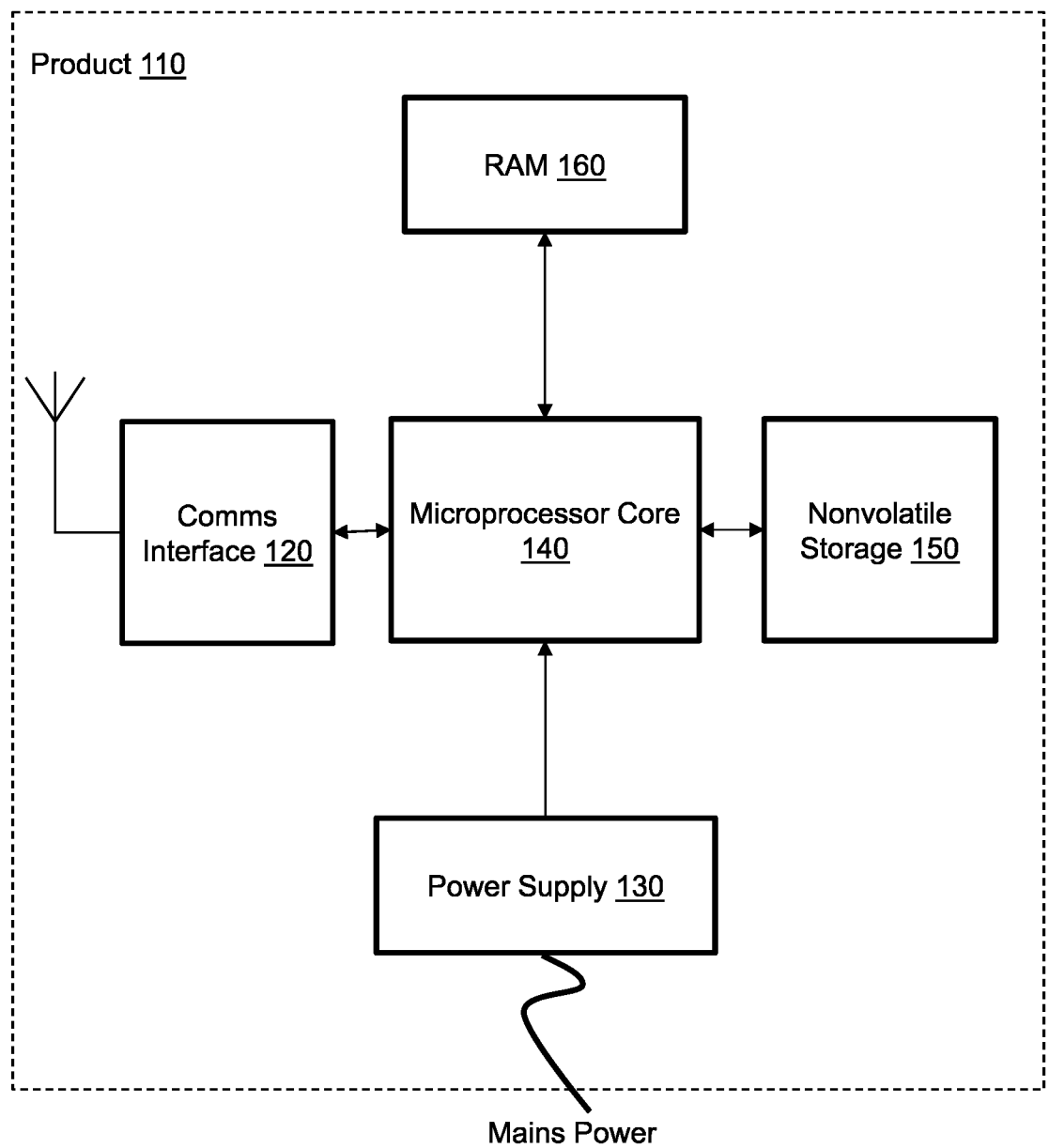
FIG. 1 illustrates a system diagram in accordance with an embodiment of the invention.

Unless otherwise indicated illustrations in the figures are not necessarily drawn to scale.

DETAILED DESCRIPTION OF SOME EMBODIMENTS

Background and Context

The particular values and configurations discussed in these non-limiting examples can be varied and are cited merely to illustrate one or more embodiments and are not intended to limit the scope thereof.

Subject matter will now be described more fully herein after with reference to the accompanying drawings, which form a part hereof, and which show, by way of illustration, specific example embodiments. Subject matter may, however, be embodied in a variety of different form and, therefore, covered or claimed subject matter is intended to be construed as not being limited to any example embodiments set forth herein, example embodiments are provided merely to be illustrative. Likewise, a reasonably broad scope for claimed or covered subject matter is intended. Among other issues, subject matter may be embodied as methods, devices, components, or systems. The followed detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as a "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

One having ordinary skill in the relevant art will readily recognize the subject matter disclosed herein can be practiced without one or more of the specific details or with other methods. In other instances, well-known structures or operations are not shown in detail to avoid obscuring certain aspects. This disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although claims have been included in this application to specific enumerated combinations of features, it should be understood the scope of the present disclosure also includes any novel feature or any novel combination of features disclosed herein.

References "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

Headings provided are for convenience and are not to be taken as limiting the present disclosure in any way.

Each term utilized herein is to be given its broadest interpretation given the context in which that term is utilized.

Terminology

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., *Mars Inc. v. H.J. Heinz Co.*, 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ."

A description of an embodiment having components in communication with each other does not infer that all enumerated components are needed.

A commercial implementation in accordance with the scope and spirit of the present disclosure may be configured according to the needs of the particular application, whereby any function of the teachings related to any described embodiment of the present invention may be suitably changed by those skilled in the art.

The flowchart and block diagrams in the figures illustrate the architecture, functionality, and operation of possible implementations of systems and methods according to various embodiments. Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

The functionality and/or the features of a particular component may be alternatively embodied by one or more other devices that are not explicitly described as having such functionality/features. Also, various embodiments of the present invention need not include a device itself.

More specifically, as will be appreciated by one skilled in the art, aspects of the present invention may be embodied as a system and/or method. Furthermore, aspects of the present invention may take the form of a plurality of systems to enable gas meter to perform self-checking to determine its overall functioning without requiring a meter operator.

Introduction

Embodiments of the present invention include a computing system that lacks storage space in its internal random-access memory (RAM) and needs to be able to redirect input and output to arbitrary storage and a decompressed patch image. The arbitrary storage can include nonvolatile storage that is located within the same computing system, or located externally to the computing system.

The embodiments of the present invention can also include a delta image that can be applied to reduce a transfer time for a decompressed patch image. Run length encoding can be applied to reduce a patch file size that includes the delta image. A patching algorithm can work directly on an encoded patch file. Storage areas occupied by a patch file and a resulting image can overlap. Accordingly, the run length encoding is applied to reduce the size of the patch file that includes the delta image. The patch file is then compressed and then decompressed.

In anticipation of the need for the microprocessor core within the computing system to redirect input and output and also the decompressed patch file within the computing system to the arbitrary storage, the microprocessor core will perform calls to a system of memory caches to facilitate the redirecting of the input and output and the decompressed patch image to the arbitrary storage. The arbitrary storage can be within the same computing system as the microprocessor core, or can be external to the computing system.

The arbitrary storage can include, but is not limited to, additional random-RAM, read-only memory (ROM), electrically erasable programmable read-only memory (EEPROM), flash, and one or more other serial devices. The microprocessor core can thereby redirect the input and output and the decompressed patch file to the nonvolatile or arbitrary storage in response to a lack of available storage within its internal RAM.

System Structure

FIG. 1 illustrates a high level system (system) 100. The system will include a product 110 that can receive input. The system 100 also includes a communication (comms) interface 120 that is configured to communicate with a microprocessor core 140. The microprocessor core 140 will be powered by a power supply 130 that provides the main power, and include one or more processors. A nonvolatile storage 150 will be connected to the microprocessor 140. Random access memory (RAM) 160 is also illustrated. The RAM 160 is connected to the microprocessor core 140.

Referring to FIG. 1, the system 100 will receive input such as an inputted compressed image. The microprocessor core 140 will decompress the inputted compressed image. In addition, the microprocessor core 140 will apply one or more delta images to reduce a transfer time for the decompressed patch image. The microprocessor core 140 will attempt to place any input including the decompressed patch image within the system 100 into either the RAM 160 or the nonvolatile storage 150. The nonvolatile storage 150 can be the arbitrary storage in which output and input and the decompressed patch image file can be redirected to if the RAM 160 does not have any available space to store the input and output and decompressed patch image file. The microprocessor core 140 will make calls to a system of caches within the nonvolatile storage 150 to facilitate redirecting the input and output including the decompressed patch image to the nonvolatile storage 150 due to the lack of available storage within the RAM 160. The microprocessor core 140 will make the calls to the system of caches due to a shortage of memory in the RAM 160. The nonvolatile storage 150 can be within the same computing system as the microprocessor core 140. Alternatively, the nonvolatile storage 150 can be external to the high-level system 100 as well.

In FIG. 1, the microprocessor core 140, based on the calls to the system of caches, can redirect input and output including the decompressed patch image to the nonvolatile storage 150 to store the input and output. The nonvolatile storage can include additional RAM, EEPROM, ROM, Flash, and other serial devices, etc. When there is a lack of available space in the RAM 160 in the high-level system 100, the microprocessor core 140 will make calls to a system of caches including the nonvolatile storage 150 to facilitate the redirection of the input and output and decompressed patch image. The microprocessor core 140, after making the calls to the system of caches, will then redirect the input and output and decompressed patch image to the nonvolatile storage 150 to allow the input and output and decompressed patch image to be stored within the nonvolatile storage 150. As such, the redirecting input and output can be stored in additional RAM, ROM, EEPROM, flash and/or one or more other serial devices.

Figure 2:
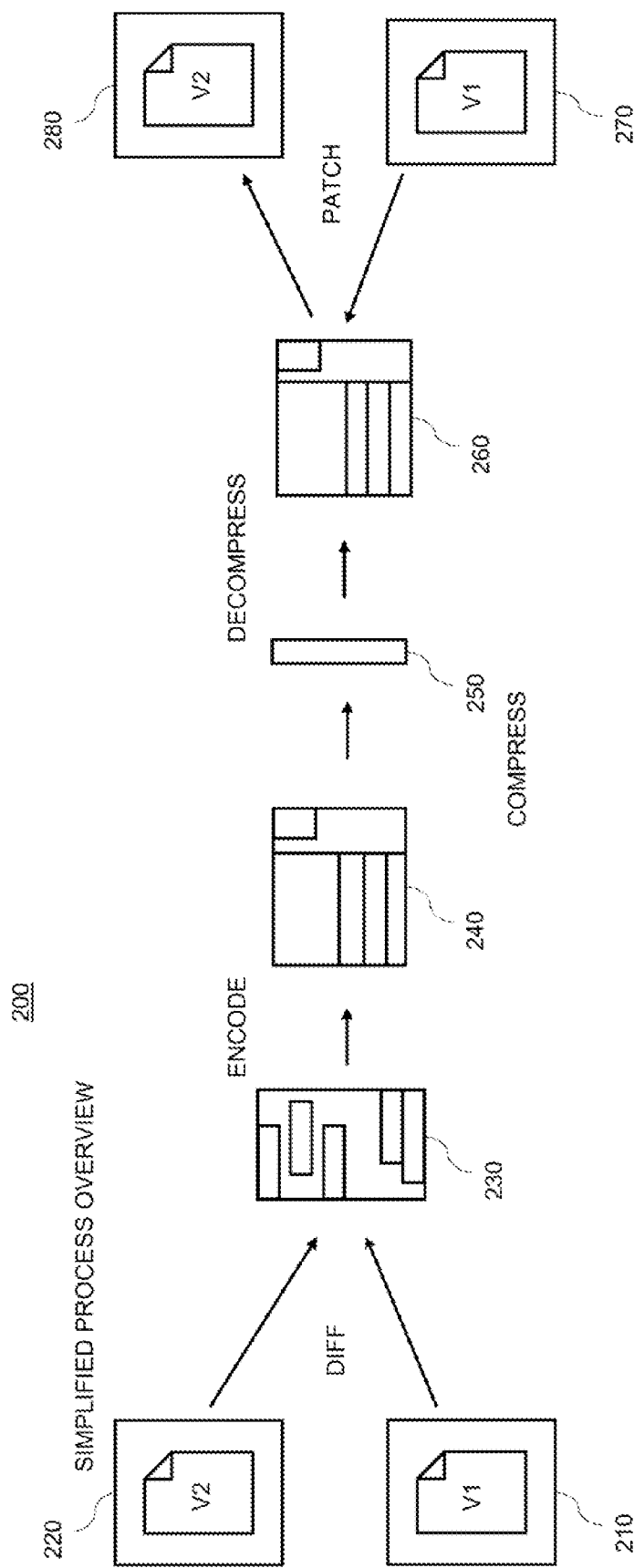
FIG. 2 illustrates schematic diagram in accordance with an embodiment of the invention.

In FIG. 2, a process 200 illustrating the application of the decompressed patch image is illustrated. An original image V1 210 and a delta patch image V2 220 are shown. The original image V1 210 and the new delta patch image V2 220 are applied to create a patch file 230. At the patch file 230, run length encoding is applied. Moreover, run length encoding is applied to reduce the size of the patch file 230. As such, run length encoding is applied to the patch file 230. As a result of the run length encoding, a reduced size of the patch file 240 is illustrated. The patch file 240 can thereby be compressed to become the compressed patch image 250. The compressed patch image 250 can be inputted into a computing system and be decompressed by microprocessor core described above in FIG. 1. When the compressed patch image 250 is decompressed, the decompressed patch image 260 is illustrated. The decompressed patch image 260 can then be redirected by the microprocessor core to arbitrary storage that is located within the same computing system as the internal RAM, or external to the computing system and away from the internal RAM. The delta patch image V2 280 and original image V1 270 can then be removed from the decompressed patch image 260.

Referring to FIG. 2, in summary, the patch file 230 can be created from the delta patch image 220 and the original image 210. Run length encoding can be applied to reduce the size of the patch file 230. The reduced size of the patch file can become the reduced patch file 240. The reduced patch file 240 can be compressed to be a compressed patch file image 250. The compressed patch file image 250 can be decompressed to become the decompressed patch file image 260. The decompressed patch file image 260 can be redirected to arbitrary storage due to a lack of storage space within the internal RAM. The microprocessor can redirect the decompressed patch file image 260 to the arbitrary storage. The original image 270 and the delta patch image 280 can then be released from the decompressed patch file 261).

Figure 3:
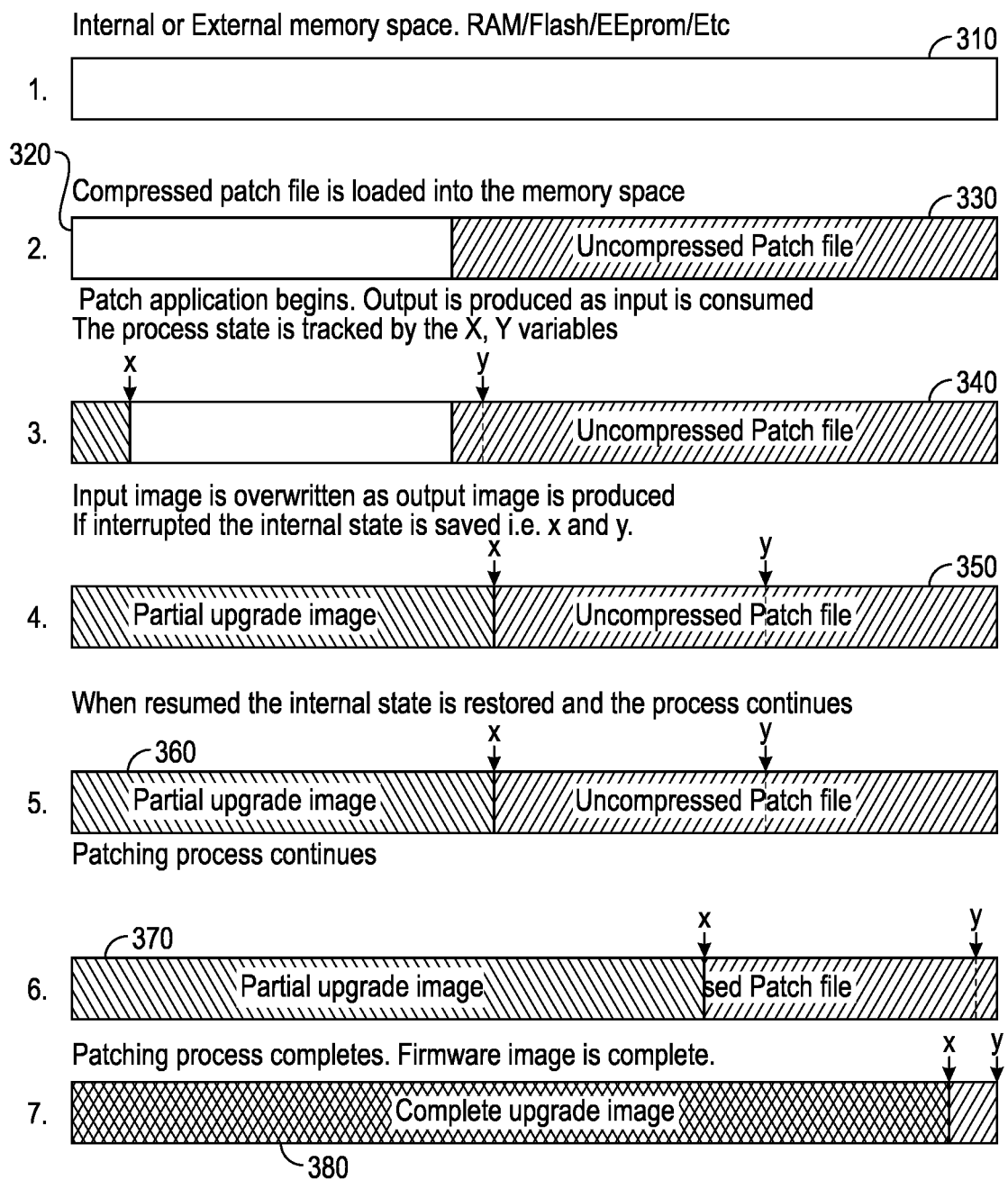
FIG. 3 illustrates a system diagram in accordance with an embodiment of the invention.

In FIG. 3, a process of 300 of the present invention is illustrated. An example view of an external memory during the decompression process is illustrated. At 310, an internal/external memory space is shown. That internal/external memory space can include, but is not limited to, a RAM, flash, and an electrically erasable programmable read-only memory (EEPROM). At 330, an uncompressed patch file 320 is loaded onto the internal/external memory. The patch application begins as a result. Output is produced as input is consumed. The process state is tracked by the variables X and Y at 340. Moreover, at 340, the X and Y variables with the partial image upgrade and the uncompressed patch file are illustrated. X refers to the partial image upgrade, while Y refers to the uncompressed patch file. At 350, an input image is overwritten as an output image is produced. If interrupted, the internal state is saved. The partial upgrade image is being applied onto the compressed path file at 350. Nevertheless, when the internal state is restored, the process continues at 360 with the partial upgrade image, the X and Y variables in relation to the partial image upgrade and the uncompressed patch file are shown respectively. Then, at 370, the patching process continues. The partial upgrade image begins to override the uncompressed patch file. In the process 300, the partial upgrade image should ultimately override the uncompressed patch file in the internal/external memory 310. At 380, the upgrade image is completed. The partial upgrade image has completely overwritten the uncompressed patch file.

Referring to FIG. 3, a process of a complete upgrade image is illustrated. Within an internal/external memory, an uncompressed patch file is loaded. After the uncompressed image file is uploaded, the patch application can begin. The patch image can be uploaded into external/internal memory. The patch file image will begin to override the inputted uncompressed patch file. In other words, the upgrade image is output image that is produced that will override the inputted uncompressed patch file. If there are any interruptions during the process 300, the internal state is saved. The variable X indicates the state of the partial upgrade image while the variable Y indicates the state of the uncompressed patch file. After the process is resumed following any interruptions, the partial upgrade image will continue to override the inputted compressed patch file within the internal/external memory. The variable X continuously slides over toward the uncompressed patch file to indicate the upgrade image overriding the inputted uncompressed patch file. Eventually, the upgrade image is complete as the upgrade image completely overrides the patch file. As such, the upgrade image has been successfully loaded onto the internal/external memory space 310.

Figure 4:
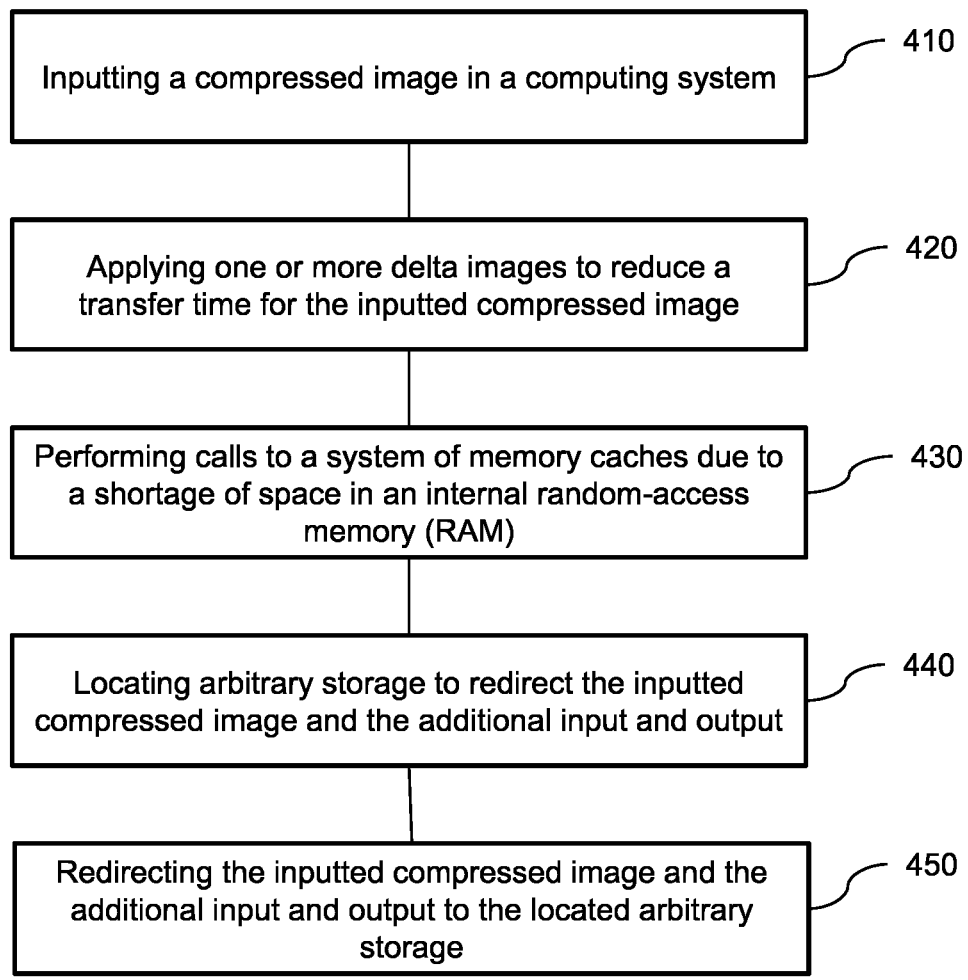
FIG. 4 depicts a flow chart in accordance with an embodiment of the invention.

In FIG. 4, a process 400 is illustrated in which the microprocessor core of the computing system redirects input and output that includes an inputted compressed patch image that is later decompressed to arbitrary storage.

Referring to FIG. 4, at 410, an inputted compressed patch image is received. The patch image is then decompressed. Moreover before, compression, run length encoding was applied to reduce the size of the patch image file that includes a delta image. Run length encoding is removed during the patching process whereby the new patch image is outputted.

In FIG. 4, at 420, one or more delta images are applied to reduce a transfer time for the inputted compressed image. One or more delta images are applied to the inputted compressed image. Run length encoding will be applied to reduce the size of the image file that includes the delta image and original image.

Referring to FIG. 4, at 430, the microprocessor core will perform calls to a system of memory caches. Further, the microprocessor core will perform calls to a system of memory caches or arbitrary storage to facilitate redirecting the decompressed patch image and additional input and output to the arbitrary storage. The arbitrary storage can be located within the same computing system as the microprocessor core. Alternatively, the arbitrary storage can be configured external to the computing system with the microprocessor core.

In FIG. 4, at 440, the microprocessor core locates the arbitrary storage to redirect the inputted and decompressed patch image and the additional input and output. The microprocessor locates the additional RAM, ROM, EEPROM, and/or flash in which the decompressed patch image and additional input and output will be redirected to for storage. The additional storage can be within the same computing system as the microprocessor core, or be external to the microprocessor core in another computing system.

With respect to FIG. 4, at 450, the microprocessor core redirects the decompressed patch image and the additional input and output to the arbitrary storage for storage. As mentioned above, the arbitrary storage can be external to the computing system containing the microprocessor core, or be within the same computing system as the microprocessor core.

Those skilled in the art will appreciate that the example embodiments are non-exhaustive and that embodiments other than that described here may be included without departing from the scope and spirit of the presently disclosed embodiments.

Advantages/Summary

Overall, a microprocessor core in a computing system can identify when there is a shortage of storage space within the storage of the computing system. The available RAM within the computing system may not have enough storage space to store input and output.

In addition, the application of one or more delta images will reduce a transfer time for an inputted compressed and then decompressed image. The delta image and an original image can be inputted. Applying the delta image will reduce the transfer time for the patch image. Run length encoding can be applied to reduce the patch file size. After the run length encoding is applied to produce the reduced patch file size, the patch file can be compressed then and then decompressed. The microprocessor core can attempt to store the decompressed patch image and additional input and output in internal RAM configured within the computing system.

The microprocessor core will attempt to facilitate redirecting the decompressed patch image and additional input and output to arbitrary storage when there is a lack of available storage in the internal RAM. The microprocessor core will thereby perform calls to a system of memory caches that include additional RAM, and also ROM, EEPROM and/or flash. After the microprocessor core performs the calls to the system of memory caches to facilitate the redirecting of the input and output to the nonvolatile storage, the microprocessor core redirects the decompressed patch image and input and output to the nonvolatile storage. The nonvolatile storage can include any one of additional RAM, ROM EEPROM, flash, and other serial devices and can be external to the microprocessor core or be within the same computing system.

Accordingly, the microprocessor core attempts to facilitate the redirecting of input and output when the microprocessor identifies a shortage of storage space within the computing system. After the calls are made to the system of memory caches, the microprocessor core can redirect any input and output to the nonvolatile storage for storage due to a lack of available storage within the computing system. The nonvolatile storage can be within the same computing system, or can be external to the computing system. The nonvolatile storage can include additional RAM, and also ROM, EEPROM, flash, and other serial devices to store the redirected input and output.

In addition, one or more delta images can be applied to reduce a transfer time for a decompressed patch image. Run length encoding can be provided to reduce the patch file size. The patch file can then be compressed and then decompressed. The microprocessor core can redirect the decompressed patch image to the arbitrary storage configured external or within the same computing system as the microprocessor core.

CONCLUSION

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

What is claimed is:

1. A method comprising:
   inputting and decompressing a compressed patch image in a computing device;
   applying one or more delta images by a processor to reduce a transfer time for the decompressed patch image, wherein, before compression, applying run length encoding to a patch image to reduce the patch image size and the reduced size patch image is compressed to produce the compressed patch image;
   performing one or more calls to a system of memory caches by the processor for reads and writes of the decompressed patch image and additional input and output due to a shortage of space in an internal random-access memory (RAM), and locating additional storage by the processor to redirect the decompressed patch image and the additional input and output;
   redirecting the decompressed patch image and the additional input and output by the processor to the located additional storage for storage; and
   producing an upgrade image in the additional storage, in response to storing the decompressed patch image in the additional storage, wherein the upgrade image overrides the decompressed patch image.

2. The method of claim 1, wherein the decompressed patch image is redirected to the additional storage that is within a same computing system as the computing device.

3. The method of claim 1, wherein the additional input and output is redirected to the additional storage located in an external system.

4. The method of claim 1, further comprising:
   adding additional memory caches to provide increased patch application speed.

5. The method of claim 1, further comprising:
   modifying an algorithm to remove multiple consecutive writes to a storage address.

6. The method of claim 1, wherein the decompressed patch image is redirected to at least one additional RAM located in an external system.

7. The method of claim 1, wherein the additional input and output are redirected to at least one serial device.

8. A method comprising:
   receiving and decompressing one or more compressed patch images into one or more computing devices, wherein, before, compression, applying run length encoding to a patch image to reduce the patch image size and the reduced size patch image is compressed to produce the compressed patch image;
   attempting to store the one or more decompressed patch images by at least one processor into an internal random-access memory (RAM), performing calls to a system of memory caches to store the one or more decompressed patch images due to a lack of storage space in the RAM, wherein the at least one processor performs calls to a system of memory caches to facilitate redirecting the one or more decompressed patch images, and locating one or more serial devices by the at least one processor;
   redirecting the one or more decompressed patch images to the one or more serial devices for storage; and
   producing an upgrade image in the one or more serial devices, in response to storing the one or more decompressed patch images in the one or more serial devices, wherein the upgrade image overrides the one or more decompressed patch images.

9. The method of claim 8, wherein the one or more compressed patch images are decompressed and redirected to at least one electrically erasable programmable read-only memory (EEPROM).

10. The method of claim 8, further comprising:
    enabling a patching algorithm to work directly on an encoded patch file.

11. The method of claim 8, wherein storage areas occupied by a patch file and a resulting image overlap.

12. The method of claim 8, further comprising:
    applying delta images to enable a reduction in transfer time.

13. A system comprising:
    a computing device receiving an inputted compressed patch image that is decompressed at a later time interval;
    a processor applying one or more delta images contained in the decompressed patch image to facilitate an overall reduction in transfer time of the decompressed patch image, wherein, before compression, applying run length encoding to a patch image to reduce the patch image size and the reduced size patch image is compressed to produce the compressed patch image;

performing one or more calls to a system of memory caches for reads and writes of the decompressed patch image and additional input and output due to a shortage of space in an internal random-access memory (RAM), and locating additional storage to redirect the decompressed patch image and the additional input and output; and the additional storage that receives the redirected decompressed patch image and the additional input and output for storage; and producing an upgrade image in the additional storage, in response to storing the decompressed patch image in the additional storage, wherein the upgrade image overrides the decompressed patch image.

14. The system of claim 13, wherein the additional storage includes a patch file overlapping with a resulting image.

15. The system of claim 13, wherein the processor removes run length encoding after decompression.

16. The system of claim 13, wherein the size of a patch file is reduced.

17. The system of claim 13, wherein the processor redirects the decompressed patch image to at least one of an additional RAM or electrically erasable programmable read-only memory (EEPROM) storage.

18. The system of claim 13, wherein the processor enables a patching algorithm to work in place while the additional storage is occupied by a patch file.

* * * * *